(12) United States Patent
Mugino et al.

(10) Patent No.: US 6,335,944 B1
(45) Date of Patent: Jan. 1, 2002

(54) SEMICONDUCTOR LASER MODULE

(75) Inventors: Akira Mugino, Tokyo; Takeo Shimizu, Fujisawa, both of (JP)

(73) Assignee: The Furukawa Elctric Co., LTD, Tokyo (JP)

( * ) Notice: Subject to any disclaimer, the term of this patent is extended or adjusted under 35 U.S.C. 154(b) by 0 days.

(21) Appl. No.: 09/671,445

(22) Filed: Sep. 27, 2000

Related U.S. Application Data

(63) Continuation of application No. PCT/JP99/07062, filed on Dec. 16, 1999.

(30) Foreign Application Priority Data

Jan. 27, 1999 (JP) ............................................ 11-019046

(51) Int. Cl.[7] ................................................ H01S 3/10
(52) U.S. Cl. ............................ 372/102; 372/20; 372/32
(58) Field of Search ............................ 372/92, 102, 20, 372/32

(56) References Cited

U.S. PATENT DOCUMENTS 6,125,222 A * 9/2000 Anthon ......................... 385/33

FOREIGN PATENT DOCUMENTS

| EP | 0 380 242 A2 | 8/1990 |
|----|--------------|--------|
| JP | 5-63295      | 3/1993 |
| JP | 5-82887      | 4/1993 |
| JP | 8-181390     | 7/1996 |
| JP | 10-209570    | 8/1998 |

OTHER PUBLICATIONS

T. Kato, et al., The Institute of Electronics, Information and Communications Engineers, pp. 1–6, "Multi–Wavelength Bragg Fiber–Grating Semiconductor Laser Array", May, 1997 (with English Abstract).

T. Tanaka, et al., The Institute of Electronics, Information and Communications Engineers, pp. 7–12, "UV Written Waveguide Grating and Its Application to Integrated External Cavity Lasers", May, 1997 (with English Abstract).

A. Hamakawa, et al., 2nd Optoelectronics & Communications Conference(OECC'97) Technical Digest, pp. 224–225, "1480NM Pump Fiber–Grating External–Cavity–Laser with Two Fiber Gratings", Jul., 1997.

Y. Ibusuki, et al., The Institute of Electronics, Information and Cmmunications Engineers, vol. 98, No. 472, pp. 7–12, "Wavelength Stabilizing Fibre Bragg Grating For 1.48 $\mu$ m Pump–LD", Dec., 1998 (with English Abstract).

A. Mugino, et al., The Institute of Electronics, Information and Communications Engineers, vol. 1988, No. 4, p. 389, Simulation of a Pumping Laser with Fiber Bragg Grating Feedback, Mar. 27–30, 1998.

* cited by examiner

*Primary Examiner*—James W. Davie
(74) *Attorney, Agent, or Firm*—Oblon, Spivak, McClelland, Maier & Neustadt, P.C.

(57) ABSTRACT

A semiconductor laser module of an external-cavity type in which a GaAs/AlGaAs-based semiconductor laser having ripples in the gain-wavelength characteristic thereof and an optical transmission medium including a Bragg grating are optically coupled by an optical coupling member. A gain peak wavelength ($\lambda$(Ith)) for the case where the modularized semiconductor laser is driven with a threshold current (Ith) is set on the shorter-wavelength side of the reflection center wavelength ($\lambda$BG) of the Bragg grating, a gain peak wavelength ($\lambda$(Iop)) of the semiconductor laser for a maximum operating current (Iop) is set on the longer-wavelength side of the gain peak wavelength ($\lambda$(Ith)), a pulling wavelength width ($\lambda$PULL) and a de-tuning width ($\lambda$detun) of the semiconductor laser module are set so that the de-tuning width ($\lambda$detun) is smaller than the pulling wavelength width ($\lambda$PULL), the resulting difference (=$\lambda$PULL–$\lambda$detun) is greater than the full width at half maximum of the reflection spectrum of the Bragg grating, and the gain peak wavelength ($\lambda$(Ith)) is on the longer-wavelength side of a limit value ($\lambda$LIMIT).

15 Claims, 9 Drawing Sheets

SEMICONDUCTOR LASER MODULE

This appln is a continuation of PCT/JP99/07062 filed Dec. 16, 1999.

TECHNICAL FIELD

The present invention relates to a semiconductor laser module for emitting laser light, and more specifically, to a semiconductor laser module for exciting an $Er^{3+}$, $Al^{3+}$ doped fiber amplifier (EDFA).

BACKGROUND ART

Conventionally, the wavelength of light emitted from a light emitting device is stabilized by using means that optically feeds back light from a multi-mode oscillation laser by any means, thereby making the oscillation wavelength mode of the laser single.

Lasers of this type include, for example, a distributed feedback (DFB) laser, in which a diffraction grating is formed on an active layer of a semiconductor laser device, a distributed Bragg reflector (DBR) laser, in which a reflective diffraction grating having a transparent reflection characteristic for emitted light with a wavelength different from the Bragg wavelength is formed along the longitudinal direction of a waveguide portion that is formed of a semiconductor medium of a semiconductor laser device, whereby the light is reflected on (or fed back to) an active layer, etc.

With the recent rapid progress of a fiber Bragg grating (FBG), in which an optical fiber is given a light diffraction function by changing the refractive index in a core in the axial direction, various techniques for lasers with FBG have been disclosed. For example, "Multi-wavelength Bragg fiber-grating semiconductor laser array" is described in the Technical Report of IEICE (the Institute of Electronics, Information and Communication Engineers) OPE 97-1 by Kato et al., and "UV written waveguide grating and its application to integrated external-cavity laser" is described in OPE97-2 by Tanaka et al.

For a light source for EDFA excitation, moreover, a technique for stabilizing the wavelength of a 1,480 nm band pump laser by means of a fiber Bragg grating (FBG) is reported in $2^{nd}$ Optoelectronics & Communications Conference (OECC '97) Technical Digest, July 1997, Seoul, Korea by Atsushi Hamakawa et al. (Draft Collection 9D2-5, pp. 224–225, "1,480 nm pump fiber-grating external-cavity laser with two fiber gratings").

The DFB and DBR lasers described in the aforementioned documents, however, have a single-mode oscillation spectrum. They are used for a dedicated light source for optical communication. Therefore, these lasers are not suited for EDFA amplification.

The external-cavity lasers described in the Technical Report by Kato et al. and Tanaka et al. have the following problems.

(1) The aforesaid external-cavity lasers are single-mode oscillation lasers, in which mode hopping is caused such that the center wavelength of the oscillation mode changes when the working temperature changes by several degrees ° C., so that the stability of the oscillation wavelength to resist temperature change is poor.

(2) The aforesaid external-cavity lasers are hard to manufacture, since the reflectance of an anti-reflection film on its front end face should be lowered extremely. In many cases, moreover, the external-cavity lasers are constructed so that laser beams are emitted at an angle to the cleavage plane of the laser in order to lower the reflectance of the anti-reflection film equivalently. According to the external-cavity lasers constructed in this manner, therefore, the coupling efficiency of the laser beams coupled to an optical fiber is lowered, and it is very hard to fix the optical fiber with center alignment.

(3) The aforesaid external-cavity lasers are designed so that the space between the emission surface of a laser device that constitutes an external cavity and a diffraction grating for optical feedback is narrow. Accordingly, assembling a module requires complicated processes, and therefore, use of special means such as plane mounting.

(4) Output power of the aforesaid external-cavity lasers is low. Therefore, they are unfit for use as light sources for EDFA excitation.

Although the technique reported by Atsushi Hamakawa et al. is suited for the excitation of a high-power EDFA of 1,480 nm wavelength that uses an InGaAsP/InP-based semiconductor film, it has the following problems.

(1) The aforesaid technique requires use of a special fiber Bragg grating that reflects two wavelengths.

(2) According to the aforesaid technique, the variation of the oscillation wavelength attributable to change of the working temperature, although small, is about 2.6 nm.

(3) The aforesaid technique cannot be applied to a GaAs/AlGaAs-based semiconductor laser with the same construction. The InGaAsP/InP semiconductor laser is not subject to degradation that is attributable to catastrophic optical damage (COD), and the mode field pattern of its emitted light is circular. On the other hand, the GaAs/AlGaAs-based semiconductor laser is subject to the COD-induced degradation and its mode field pattern is elliptic, so that the efficiency of mode coupling with an optical fiber based on a two-lens system is very poor.

(4) In a GaAs/AlGaAs-based multi-mode oscillation semiconductor laser having random wavelength characteristics without gain ripples, the oscillation wavelength can be stabilized by modularization such that the fiber Bragg grating (FBG) is coupled to the laser. In this semiconductor laser, the state of polarization of the optical fiber continually changes depending on the bent state of the externally attached FBG, stress acting thereon, distortion, etc. In a module that uses this semiconductor laser, therefore, a light touch on the optical fiber inevitably changes the value of the monitor output current by a figure, although the optical output and the monitor output current are apparently stable. Thus, the operating characteristics of the semiconductor laser module of this type considerably changes depending on the state of polarization, fiber shape, etc. of the optical fiber.

(5) In the semiconductor laser module coupled with the fiber Bragg grating, furthermore, mode competition between light oscillated in a mode of the FBG and light oscillated in the Fabry Perot (FP) mode causes fluctuation of the optical output power on the front end face of the semiconductor laser, which is attributable to mode hopping, and fluctuation of the optical output power on the rear end face that is used to monitor the optical output.

In this case, in particular, power fluctuation on the monitor side of the rear end face of the semiconductor laser (optical output on the rear end face side is converted into current by means of a photodiode in the semiconductor laser module) or fluctuation of the monitor output current is more susceptible than that on the side of the front end face of the semiconductor laser.

The semiconductor laser uses the monitor output current to control the optical output automatically. If mode hopping or mode competition occurs in the semiconductor laser, in this case, the monitor output current changes rectangularly or in the shape of spikes with time, so that automatic control is impossible. If the monitor output current of the semiconductor laser is reduced rectangularly, moreover, high current flows into the semiconductor laser in order to maintain the constant optical output, possibly damaging the semiconductor laser and arousing a great problem on the operational reliability.

The present invention has been contrived in consideration of these circumstances, and its object is to provide a semiconductor laser module, which enjoys high oscillation wavelength stability against operating current injected into a semiconductor laser and temperature change, and is suited for use as a light source for EDFA excitation or a high-output, low-noise light source.

DISCLOSURE OF THE INVENTION

A semiconductor laser module according to the present invention, which includes the following means, can restrict fluctuation of optical outputs or fluctuation of monitor output current, which is caused in case of mode hopping or mode competition, within a practically negligible range, in consideration of the relation between a reflection center wavelength $\lambda BG$ of a Bragg grating and a gain peak wavelength $\lambda LD(I)$ for an operating current injected into a semiconductor laser, that is, an injection current (I).

In a pump laser for an optical fiber amplifier, a GaAs/AlGaAs-based semiconductor laser having a resonance mode form of a gain wavelength characteristic in a natural emission region shown in FIG. 1A and a net gain form shown in FIG. 1B is designed to construct a semiconductor laser module of an external-cavity type by using optical feedback means such as a Bragg grating. In this case, the module has the following features based on the relation between the reflection center wavelength $\lambda BG$ of the Bragg grating and the gain peak wavelength of the semiconductor laser.

The following is a description of the meanings of a maximum operating current Iop and a pulling wavelength width $\lambda PULL$.

Normally, the maximum operating current Iop is a maximum injection current that ensures oscillation of the semiconductor laser. If the injection current exceeds a certain value, the optical output is saturated, so that there is no linear relation between the optical output and the injection current. This is a kink phenomenon as it is called. If a high current is injected to cause the kink phenomenon, the refractive index of each component layer that constitutes the semiconductor laser is lowered by a plasma effect, band-filling effect, etc. Accordingly, the semiconductor laser cannot confine light that is generated in an active layer, so that the optical output emission angle changes, and the optical output changes substantially. The injection current that causes the kink phenomenon is referred to generally as a kink current. Thus, in the semiconductor laser module, the maximum operating current Iop of the semiconductor laser is generally adjusted to a current value that is equivalent to a value as low as 15 to 20% of the output power of the kink current, in consideration of the reliability of the module (see dotted line of FIG. 12).

The output characteristic of the optical output (mW) for an injection current I (mA) will be further described in detail with reference to the characteristic curves of FIG. 12. If the optical output that causes the kink phenomenon and 20%-lower optical output in FIG. 12 are Pkink and Pop, respectively, the operating current value corresponding to the optical output Pop is Iop. In FIG. 12, the full line represents the initial characteristic of the semiconductor laser before aging, and the injection current value corresponding to the optical output Pop is IBOL (beginning of life). On the other hand, aging occurs when the semiconductor laser starts to be used. In order to maintain a constant output despite the advance of degradation, the semiconductor laser is expected to ensure that the operating current never exceeds a given level. The maximum value of the injection current for this case is given by IEOL (end of life). Thereupon, the maximum operating current Iop according to the present invention must be set within the range of $\Delta Iop$ indicated by the arrow in FIG. 12.

On the other hand, the pulling wavelength width $\lambda PULL$ is the difference between the reflection center wavelength $\lambda BG$ of the Bragg grating and the gain peak wavelength with which the oscillation mode of the semiconductor laser module changes from the Bragg grating mode into the Fabry-Perot mode. For example, the value of the difference $(=\lambda BG - \lambda FP)$ between the reflection center wavelength $\lambda BG$ of the Bragg grating in the semiconductor laser module and a gain peak wavelength $\lambda FP$ that is obtained when the semiconductor laser undergoes Fabry-Perot oscillation is equal to the pulling wavelength width $\lambda PULL$. In the present specification, in particular, the gain peak wavelength $\lambda FP$ that is obtained when the semiconductor laser undergoes Fabry-Perot oscillation is referred to as a shorter-wavelength-side limit value $\lambda LIMIT$ of the pulling wavelength width $\lambda PULL$ for the duration of the Bragg grating mode oscillation.

In order to stabilize the optical output, narrow-band oscillation wavelength (e.g., 5 nm or less), and monitor output current characteristic of the semiconductor laser, a semiconductor laser module according to the present invention is a semiconductor laser module of an external-cavity type, in which a GaAs/AlGaAs-based semiconductor laser having ripples in the gain-wavelength characteristic thereof and an optical transmission medium including a Bragg grating are optically coupled by means of optical coupling means, designed so that a gain peak wavelength $\lambda(Ith)$ for the case where the modularized semiconductor laser is driven with a threshold current Ith is set on the shorter-wavelength side of the reflection center wavelength $\lambda BG$ of the Bragg grating, a gain peak wavelength $\lambda(Iop)$ of the semiconductor laser for a maximum operating current Iop is set on the longer-wavelength side of the gain peak wavelength $\lambda(Ith)$, a pulling wavelength width $\lambda PULL$ and a de-tuning width $\lambda detun$ of the semiconductor laser module defined below are set so that the de-tuning width $\lambda detun$ is smaller than the pulling wavelength width $\lambda PULL$, the resulting difference $(=\lambda PULL - \lambda detun)$ is greater than the full width at half maximum of the reflection spectrum of the Bragg grating, and the gain peak wavelength $\lambda(Ith)$ is on the longer-wavelength side of a limit value $\lambda LIMIT$ described below.

The pulling wavelength width $\lambda PULL$ of the semiconductor laser module is the difference between the reflection center wavelength $\lambda BG$ of the Bragg grating and a gain peak wavelength obtained when the oscillation mode of the semiconductor laser module changes from the Bragg grating mode into the Fabry-Perot mode. The de-tuning width $\lambda detun$ is a wavelength range from the shorter-wavelength-side limit value $\lambda LIMIT$ of the pulling wavelength width $\lambda PULL$ to the gain peak wavelength $\lambda(Iop)$.

The optical output and monitor output current of the semiconductor laser can be stabilized by constructing the semiconductor laser module in this manner.

Preferably, the semiconductor laser module is designed so that a threshold current Ith(LD) of the sole semiconductor laser is higher than the threshold current Ith of the modularized semiconductor laser, and an oscillation wavelength λLD(Ith) for the threshold current Ith(LD) is shorter than the oscillation wavelength of the modularized semiconductor laser.

FIG. 2A shows gain-wavelength characteristic curves Illustrating optimum relations between the reflection center wavelength λBG of the Bragg grating, pulling wavelength width λPULL, de-tuning width λdetun, shorter-wavelength-side limit value λLIMIT of the pulling wavelength width λPULL, and gain peak wavelengths λ(Iop) and λ(Ith) for the case where an optical output Pf and a monitor output current Im of the semiconductor laser are stable.

On the other hand, FIG. 2B shows gain-wavelength characteristic curves illustrating relations between the reflection center wavelength λBG of the Bragg grating, pulling wavelength width λPULL, de-tuning width λdetun, shorter-wavelength-side limit value λLIMIT of the pulling wavelength width λPULL, and gain peak wavelengths λ(Iop) and λ(Ith) for the case where the monitor output current Im of the semiconductor laser are considerably unstable. In FIG. 2B, ① indicates the de-tuning width λdetun for the case where a gain peak wavelength λLD (Iop1) is greater than a wavelength (=λPULL−ΔλBG), where αλBG) is the full width at half maximum of the reflection spectrum for the reflection center wavelength λBG of the Bragg grating, while ② indicates the de-tuning width λdetun for the case where a gain peak wavelength λLD (Iop2) is greater than the reflection center wavelength λBG (=λPULL+λLIMIT).

With the de-tuning width λdetun in the state ①, in the semiconductor laser, the oscillation mode competes within the full width at half maximum αλBG of the reflection center wavelength λBG of the Bragg grating, the monitor output current Im varies at several percent or more, and besides, the time-based change of the oscillation mode is spike-shaped or rectangular.

With the de-tuning width λdetun in the state ②, moreover, a lot of gain ripple peaks indicated by dotted lines exist near the reflection center wavelength λBG of the Bragg grating, and the oscillation mode of the semiconductor laser exists in a region near the reflection center wavelength λBG. Thus, the reflection center wavelength λBG is situated within the range of a region that is subject to small gain differences, so that the oscillation mode of the semiconductor laser competes between the gain ripple peak wavelengths λLD(Iop1) and λ(Iop2) and the reflection center wavelength λBG of the Bragg grating, the monitor output current Im varies at several percent or more, and besides, the time-based change of the oscillation mode is spike-shaped or rectangular.

FIGS. 3A and 3B correspond to the state of FIG. 2B for the case where the monitor output current Im of the semiconductor laser is very unstable. FIG. 3A is a spectrum distribution diagram showing optical outputs in two oscillation states measured in the case where mode competition and temporal mode hopping are caused. FIG. 3B shows an output characteristic curve illustrating a voltage version of time-based change of the monitor output current Im measured in the case where mode hopping is caused.

For comparison, on the other hand, FIGS. 4A and 4B show a spectrum distribution diagram measured when the optical output Pf and the monitor output current Im of the semiconductor laser are in the stable state shown in FIG. 2A and an output characteristic curve illustrating a voltage version of time-based change of the monitor output current Im, respectively. It is to be noted here that the axes of ordinate and abscissa of FIGS. 3B and 4B have different graduations.

Further, the threshold current Ith(LD) of the sole semiconductor laser is higher than the threshold current of the modularized semiconductor laser. In other words, the threshold current Ith of the modularized semiconductor laser is lower than the threshold current Ith(LD) of the sole semiconductor laser (Ith<Ith(LD)). Thus, lowering of the optical output that is caused as the semiconductor laser is coupled to the optical transmission medium to be modularized by means of the optical coupling means can be compensated by injecting an operating current equal to the threshold current Ith(LD) for the case where the semiconductor laser is used singly.

Thus, lowering of the properties and reliability of the semiconductor laser module of the present invention, which is attributable to the aforesaid catastrophic optical damage (COD) caused by the increase of the optical power density on the semiconductor laser end face, can be restrained, and the range of the injection currents from the threshold current Ith to the maximum operating current Iop can be widened.

Further, the semiconductor laser module of the invention is designed so that the oscillation wavelength λLD(Ith) for the threshold current Ith(LD) for the case where the semiconductor laser is used singly is shorter than the oscillation wavelength of the modularized semiconductor laser. Thus, in the semiconductor laser module, the semiconductor laser oscillation state can be stabilized more easily than in the case where the semiconductor laser is used singly. This is because if the respective gain peaks of semiconductor lasers that exhibit gain ripples are compared, sub-peaks on the shorter-wavelength side of a peak gain ripple are higher than sub-peaks on the longer-wavelength side, as seen from FIGS. 1B or 7.

Accordingly, in the semiconductor laser module of the present invention, minor laser oscillation can occur less easily if the reflection center wavelength λBG is set on the longer-wavelength side of the peak gain ripple wavelength than in the case where the reflection center wavelength λBG is set on the shorter-wavelength side. Thus, in the semiconductor laser module of the present invention, competition between the Bragg grating mode and the Fabry-Perot mode can be eased if the reflection center wavelength λBG is set in a wavelength region that is subject to fewer gain ripples without being set in a wavelength region that involves a lot of gain ripples. In other words, in the semiconductor laser module of the present invention, the oscillation mode of the semiconductor laser for the reflection center wavelength λBG thus selected is off the other Fabry-Perot mode for easier oscillation, so that the oscillation state of the Bragg grating mode is stable.

Accordingly, in the semiconductor laser module of the present invention, mode competition within the full width at half maximum ΔλBG of the reflection center wavelength λBG of the Bragg grating, which makes the optical output Pf and the monitor output current Im of the semiconductor laser unstable, cannot easily occur, so that the competition between the Bragg grating mode and the Fabry-Perot mode can be eased effectively.

Preferably, the semiconductor laser module is designed so that the reflection center wavelength λBG of the Bragg grating is set on the longer-wavelength side of the gain peak wavelength λ(Iop) of the semiconductor laser for at least one gain ripple (e.g., 3 nm longer-wavelength side in FIG. 1B) shown in FIG. 1B. Thus, in the semiconductor laser module, the optical output Pf and the monitor output current Im of the semiconductor laser can be stabilized more securely.

A semiconductor laser that has ripples in its gain-wavelength characteristic may possibly oscillates even with a sub-peak wavelength that has a gain near that of a main gain peak wavelength and is situated on the longer-wavelength side for one gain ripple. If the Fabry-Perot mode is generated with this sub-peak wavelength without the aforesaid setting, in the semiconductor laser of this type, it competes with the Bragg grating mode that is generated within the full width at half maximum $\Delta\lambda BG$ of the reflection center wavelength $\lambda BG$, so that the optical output Pf and the monitor output current Im are subject to fluctuation.

Preferably, moreover, the semiconductor laser module is designed so that the gain ripple interval of the semiconductor laser is not longer than 3.5 nm. It undergoes mode hopping, if any, of 3.5 nm or less. Thus, in the semiconductor laser module, the pulling wavelength width need not be enlarged unduly.

In other words, although the pulling wavelength width in the semiconductor laser module can be enlarged by increasing the reflectance of the Bragg grating, the optical output inevitably lowers if the reflectance increases. On the other hand, the semiconductor laser module can be designed so that the pulling wavelength width can be enlarged by lowering the reflectance of an anti-reflection film with which the front end face of the semiconductor laser is coated. In consideration of manufacturing processes, however, it is hard to lower the reflectance of the anti-reflection film to 1% or less. Further, the semiconductor laser module can be designed so that the pulling wavelength width can be enlarged by enhancing the efficiency of coupling between the optical transmission medium and the semiconductor laser. Since the longitudinal and transverse mode fields of the semiconductor laser are different from the mode fields of the optical transmission medium, however, it is hard to obtain a high efficiency of coupling between the semiconductor laser and the optical transmission medium.

Preferably, furthermore, the semiconductor laser module is designed so that the difference between the reflection center wavelength $\lambda BG$ of the Bragg grating and the gain peak wavelength $\lambda(Ith)$ is set at a large value given by $[\lambda BG - \lambda_{LD}(Ith)] > \Lambda s \times (Iop - Ith)$, with respect to the product of a shift ratio $\Lambda s$ (nm/mA) of the gain peak wavelength for each injection current in the semiconductor laser to a shift on the longer-wavelength side and the difference between the maximum operating current Iop and the threshold current Ith. Thus, the semiconductor laser module is designed so that the characteristics of the semiconductor laser to be used can be easily noticed according to data on the semiconductor laser.

This is because the shift ratio $\Lambda s$ based on the injection current of the completed semiconductor laser can be controlled substantially with good reproducibility to fulfill the specifications in the semiconductor laser manufacturing processes, according to experiences and accumulated manufacturing data on production lots. In the semiconductor laser, moreover, the value of $\Lambda s \times (Iop - Ith)$ is controlled at all times. In the semiconductor laser module, therefore, the semiconductor laser to be used can be easily selected if the gain peak wavelength $\lambda(Ith)$ of the threshold current Ith of semiconductor laser and the reflection center wavelength $\lambda BG$ of the Bragg grating are known.

Preferably, the semiconductor laser module is designed so that the difference between the reflection center wavelength $\lambda BG$ of the Bragg grating and the gain peak wavelength $\lambda(Ith)$ is set at 7 nm or more. Thus, the semiconductor laser module can use a conventional GaAs/AlGaAs-based semiconductor laser that has ripples in its gain-wavelength characteristic.

In general, the semiconductor laser has a band-filling effect such that the gain peak wavelength $\lambda(Ith)$ shifts on the shorter-wavelength side if the injection current is increased and a temperature increase effect for a shift on the longer-wavelength side. It is known that the band-filling effect develops remarkably on the lower-current side, and the temperature increase effect on the higher-current side. These two effects are intricately linked together. According to experience, the average of shift ratios $\Lambda s$ for the case where the gain peak wavelength $\lambda(Ith)$ shifts on the longer-wavelength side as the injection current increases ranges from 0.02 to 0.03 (nm/mA).

Thus, in the case where a 980 nm band semiconductor laser having an output of, for example, 100 mW or thereabout is used singly, the increase of an injection current If from 40 mA to 240 mA with the oscillation threshold current at about 40 mA is 200 mA, and the shift of the oscillation wavelength based on the injection current If is about 5 nm (=976–971 nm), as shown in FIG. 5. In consideration of ripples in the semiconductor laser module also, therefore, it is evident that the reflection center wavelength $\lambda BG$ should be selected so that the difference (=$\lambda BG - \lambda LD(Ith)$) between the reflection center wavelength $\lambda BG$ and the gain peak wavelength $\lambda(Ith)$ is 7 nm or more. FIG. 5 will be described further in detail later in connection with an embodiment of the present invention.

More specifically, the semiconductor laser module set in this manner is designed taking notice of the wavelength characteristic of the optical output so that 60% or more of the spectrum component of the optical output power of the semiconductor laser module is concentrated within the ±1 full width at half maximum of the reflection center wavelength $\lambda BG$ of the Bragg grating, and that less than 40% of the spectrum component is within the ±1 gain ripple interval of a gain peak wavelength $\lambda LD(I)$ for an injection current I for the case where the semiconductor laser is used singly. Thus, in the semiconductor laser module having this power distribution, both the optical output Pf and the monitor output current Im can be stabilized.

Preferably, in this case, the power ratio between optical output power for the reflection center wavelength $\lambda BG$ and optical output power for the gain peak wavelength $\lambda LD(I)$ is 10 dB or more. In the semiconductor laser module, this power ratio can be utilized as a criterion for screening.

Preferably, moreover, the full width at half maximum of the gain spectrum of the semiconductor laser is 15 nm or more.

Preferably, furthermore, the absorption coefficient of the semiconductor laser is 15 cm$^{-1}$ or less.

Preferably, the efficiency of coupling between the semiconductor laser and the optical transmission medium by means of the optical coupling means is 60% or more. Thus, the semiconductor laser module is designed so that lowering of the optical output that is attributable to the connection of the optical transmission medium having the Bragg grating to the semiconductor laser can be restrained, and minimum requirements for the pulling wavelength width can be fulfilled.

The optical coupling means that is used to couple the optical transmission medium and the semiconductor laser may be either a wedge-lensed fiber or an asymmetrical two-lens system.

Preferably, moreover, the front end face of the semiconductor laser is coated with an anti-reflection film having a reflectance of 6% or less. In this case, the semiconductor laser module can enjoy stable oscillation characteristics within a narrow wavelength region if the pulling wavelength width λPULL, which is settled depending on parameters such as the reflectance of the anti-reflection film, the gain spectrum full width at half maximum, absorption coefficient, feedback coupling efficiency of the semiconductor laser, and the reflectance for the reflection center wavelength λBG of the Bragg grating, is 4 nm or more.

Preferably, furthermore, the semiconductor laser is provided with temperature control means such that a desired gain peak wavelength λLD(I) can be outputted for a given injection current I. For example, a Peltier device may be used as the temperature control means. The control temperature is adjusted to room temperature or the working temperature of the semiconductor laser. In the case of a 980 nm band semiconductor laser that is used in an ordinary erbium doped fiber amplifier (EDFA), for example, the control temperature is adjusted to 25° C.

Change of the control temperature is equivalent to change of the gain peak wavelength of the semiconductor laser. Naturally, the reflection center wavelength λBG of the Bragg grating and the gain peak wavelength are set at a fixed temperature as a precondition.

It is known that the oscillation wavelength of the semiconductor laser is changed by changing the temperature. This is done because the gain peak wavelength of the semiconductor laser changes depending on a temperature Ta or Tc. The temperature Ta is the active layer temperature of the semiconductor laser, while the temperature Tc is the package temperature of the semiconductor laser.

In the case of the semiconductor laser to which the optical transmission medium having the Bragg grating is coupled, however, the oscillation wavelength is locked by the reflection center wavelength λBG of the Bragg grating if the gain peak wavelength changes. As long as the difference between the gain peak wavelength and the reflection center wavelength λBG is within the range of the pulling wavelength width λPULL, the oscillation wavelength never fails be situated corresponding to the reflection center wavelength λBG. If the relation between and preset conditions for the reflection center wavelength λBG and the gain peak wavelength of the semiconductor laser module are not fulfilled, the optical output and the monitor output current inevitably fluctuate to a marked degree.

If the semiconductor laser in the semiconductor laser module is expected to be oscillated within the range of a given wavelength, therefore, the oscillation wavelength set according to the reflection center wavelength of the Bragg grating of the optical transmission medium, and the gain peak wavelength is controlled by controlling the temperature of the semiconductor laser by means of the temperature control means. By doing this, the relation between and the preset conditions for the reflection center wavelength λBG and the gain peak wavelength of the semiconductor laser module can be fulfilled, and the selection of the semiconductor laser can be favorably facilitated further. Thus, in the semiconductor laser module of the present invention, it is also advisable to control the gain peak wavelength of the semiconductor laser according to the temperature and set the oscillation wavelength according to the reflection center wavelength λBG.

Preferably, the reflectance of the optical transmission medium for the reflection center wavelength λBG of the Bragg grating is 3% or more.

BEST MODE FOR CARRYING OUT THE INVENTION

An embodiment of the present invention will now be described in detail with reference to FIGS. 5 to 11.

Figure 6:
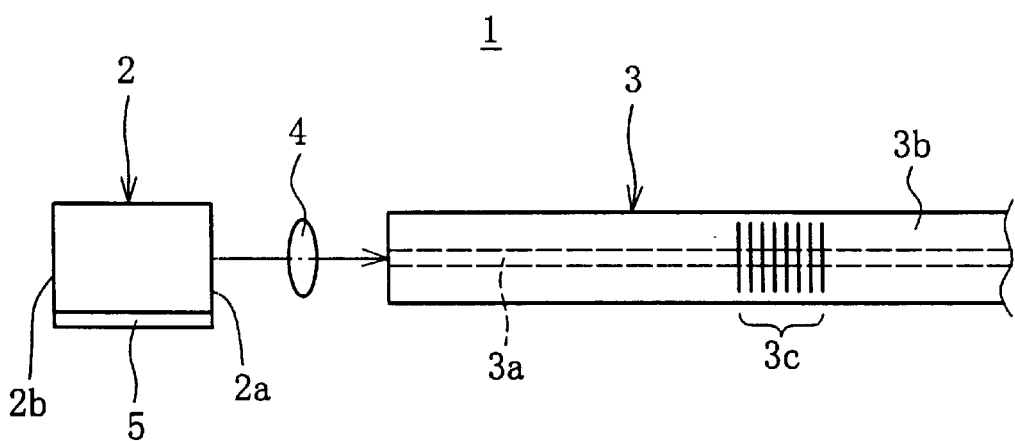
FIG. 6 is a schematic view of the semiconductor laser module of the present invention.

As shown in FIG. 6, a semiconductor laser module 1 is provided with a semiconductor laser device 2, an optical fiber 3 opposed to the semiconductor laser device 2 at a given space therefrom, and an optical coupling means 4 located between the laser device 2 and the optical fiber 3.

The semiconductor laser module 1 has the aforementioned characteristics unless mentioned specially.

The semiconductor laser device 2 has an emission surface (front end face) 2a for excitation light and a reflective surface (rear end face) 2b opposed to the emission surface 2a. A low-reflection film of 1% reflectance is formed on the emission surface 2a of the semiconductor laser device 2, and a high-reflection film of 92% reflectance on the reflective surface 2b.

The semiconductor laser device 2 is a GaAs/AlGaAs-based semiconductor laser that has ripples in its gain-wavelength characteristic. In a single state, it has a device length of 800 $\mu$m, waveguide refractive index of about 3.4, and absorption coefficient of 8 cm$^{-1}$. Its active layer is a double quantum well (DQW) structure having a width of 4.3 $\mu$m, thickness of 14 nm, and active layer confinement coefficient of 2.5×10$^{-2}$.

Further, the semiconductor laser device 2 is provided with a Peltier device 5 such that a desired gain peak wavelength $\lambda$LD(I) can be outputted for a given injection current I. The Peltier device 5 is adjusted to room temperature or the working temperature of the semiconductor laser device 2. In the case of a 980 nm band semiconductor laser that is used in an ordinary erbium doped fiber amplifier (EDFA), for example, the temperature is adjusted to 25° C.

The optical fiber 3 is an optical transmission medium that includes a core 3a and a clad 3b, the core 3a having a grating portion 3c formed of a Bragg grating.

The grating portion 3c is an optical feedback medium that returns an optical output emitted from the emission surface 2a of the semiconductor laser device 2 to the semiconductor laser device 2 according to a given coupling efficiency, and delivers it as an optical output to the right of the optical fiber 3. The grating portion 3c is formed in the core 3a by changing the refractive index along the optic axis. It is formed so that its reflectance and full width at half maximum $\Delta\lambda$BG for a reflection center wavelength $\lambda$BG (=978.95 nm) are 11.2% and 0.51 nm, respectively, as shown in the spectrum characteristic curve of FIG. 11. Thus, although the grating portion 3c is a uniform grating, as seen from FIG. 11, it is to be understood that any other type, such as a chirped grating or long-period grating, may be used as the Bragg grating formed in the optical fiber 3.

The optical coupling means 4, which serves optically to couple the semiconductor laser device 2 and the optical fiber 3, is formed of a wedge-lensed fiber having a wedged fiber end, for example. The optical coupling means 4 is located at a distance of about 10 $\mu$m from the semiconductor laser device 2, and is of a type such that the efficiency of coupling between the semiconductor laser device 2 and the optical fiber 3 is 60% or more. The coupling efficiency of the optical coupling means 4 formed of the wedge-lensed fiber was measured and found to be about 75%.

Figure 5:
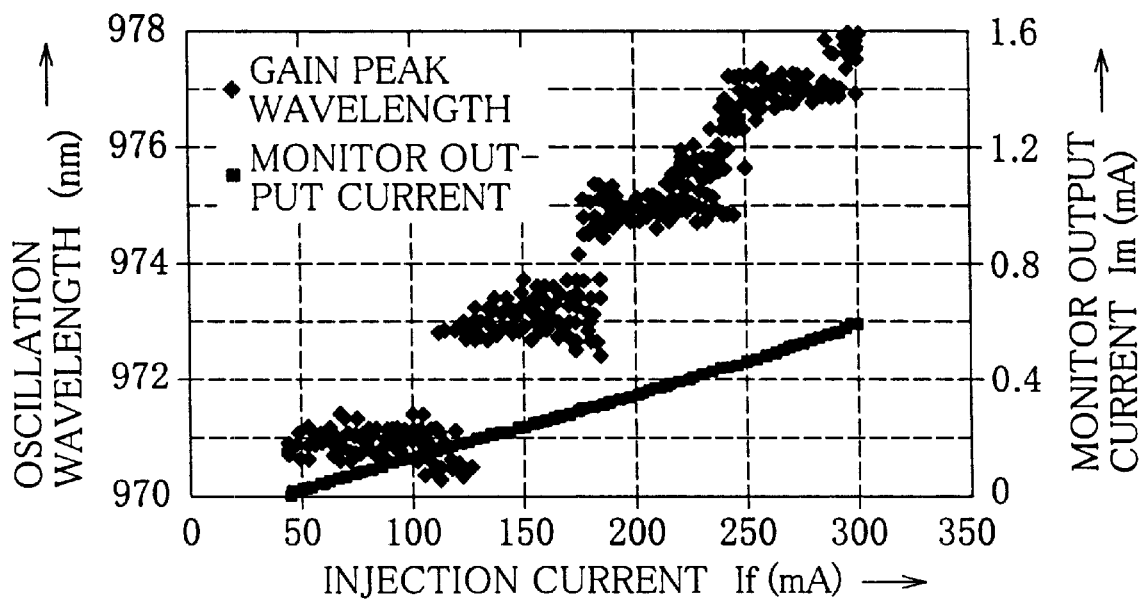
FIG. 5 shows a characteristic curve related to oscillation wavelength for the injection current of the sale semiconductor laser device used in the semiconductor laser module.

An oscillation wavelength (gain peak wavelength) for the injection current of the sole semiconductor laser device 2 was measured, whereupon the result shown in FIG. 5 was obtained. In FIG. 5, the axis of abscissa represents an injection current If (mA), the left-hand axis of ordinate represents the oscillation wavelength (nm) or gain peak wavelength $\lambda$LD(I), and the right-hand axis of ordinate represents a monitor output current Im (mA). In carrying out this measurement, the injection current If for the semiconductor laser device 2 was increased by 2 mA at a time as the oscillation wavelength was read ten times by means of a spectrum analyzer. Thus, in FIG. 5, ten square marks are dotted as oscillation wavelengths for each injection current value.

As seen from FIG. 5, the semiconductor laser device 2 starts laser oscillation when the injection current is at 42.4 mA. If a threshold current Ith(LD) of the sole semiconductor laser device 2 is at 42.4 mA, therefore, its corresponding gain peak wavelength $\lambda$LD(Ith) can be read at about 970.6 to 971.3 nm from FIG. 5. When the average of gain peak wavelengths $\lambda$LD(Ith) was calculated from the ten oscillation wavelengths measured with the injection current If at 42.4 mA with reference to FIG. 5, it was found to be about 970.8 nm.

As seen from FIG. 5, moreover, the oscillation wavelength (gain peak wavelength) $\lambda$LD(Ith) hops from 970.8 to 972.8 nm when the injection current If ranges from 120 to 130 mA. It is indicated, furthermore, that the oscillation wavelength hops from 972.4 to 975.4 nm and from 974.8 to 977.2 nm when the injection current If is at 180 mA and at 230 mA, respectively.

Figure 7:
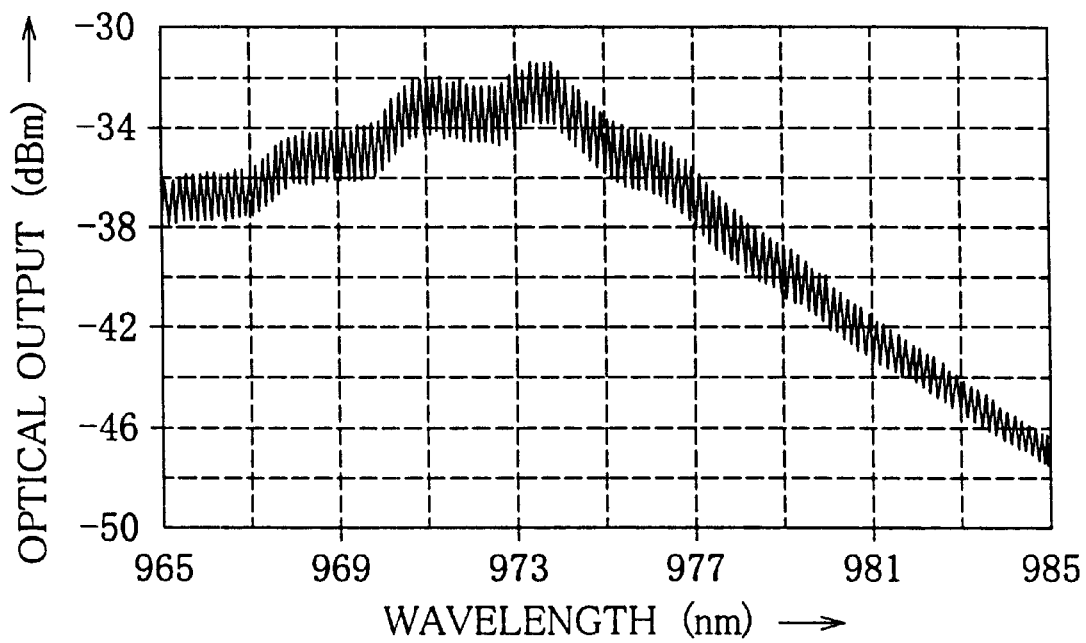
FIG. 7 shows a spectrum characteristic curve for the case where the semiconductor laser is in a Fabry-Perot resonance state in the semiconductor laser module.

Comparison of the measured values shown in FIG. 5 with gain ripples shown in FIG. 7, a spectrum characteristic curve for the semiconductor laser device 2 in a Fabry-Perot resonance state, indicates that the wavelength hopping easily occurs where there are gain ripples.

Thus, as seen from FIGS. 5 and 7, a current range Ishift from the threshold current Ith(LD) (=42.4 mA) of the sole semiconductor laser device 2 to a maximum operating current Iop (If the current value for the aforesaid IEOL is 300 mA, the upper limit of the injection current or the current value for the aforesaid IEOL is regarded as the maximum operating current Iop, in consideration of aging also.) covers about 258 mA (=300–42.4 mA). As seen from FIG. 5, therefore, an oscillation wavelength $\lambda$shift in the current range Ishift is $\lambda$(I–300 mA)–$\lambda$(I=42 mA)=978–970.8 nm=7.2 nm.

If a pulling wavelength width $\lambda$PULL of the semiconductor laser module 1 defined in claim 1 is theoretically calculated according to the aforesaid physical property parameters, the pulling wavelength width $\lambda$PULL is about 10.74 nm. On the other hand, the reflection center wavelength is $\lambda$BG=978.95 nm. Accordingly, a gain peak wavelength $\lambda$FP is about 968.21 nm, and the pulling wavelength width $\lambda$PULL is about 10.74 nm.

Figure 12:
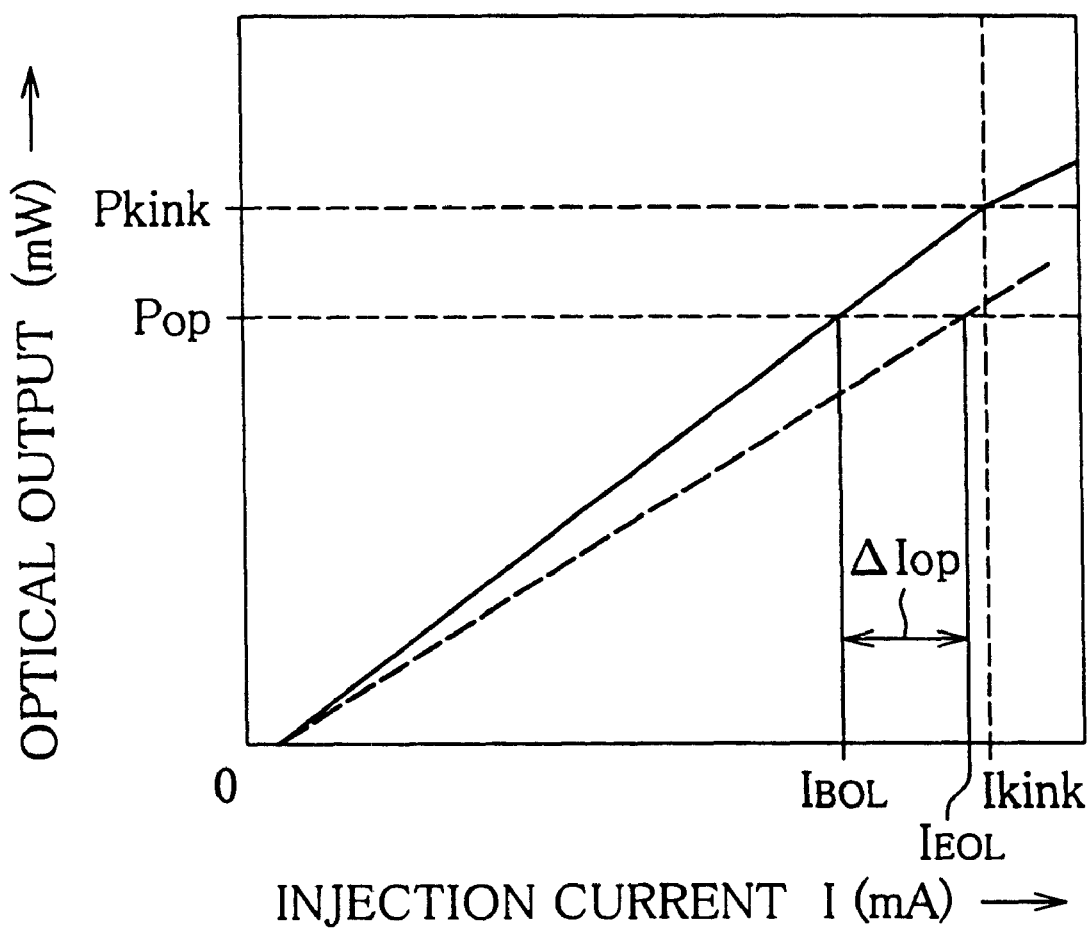
FIG. 12 shows output characteristic curves illustrating the range of an operating current Iop for IBOL and IEOL based on the relation between the optical output (mW) and an injection current (mA), given in consideration of the initial characteristic and aging of the semiconductor laser.

Thus, a de-tuning width $\lambda$detun defined in claim 1 takes values ranging from a shorter-wavelength-side limit value $\lambda$LIMIT of the pulling wavelength width $\lambda$PULL to a semiconductor laser gain peak wavelength $\lambda$(Iop) for the maximum operating current Iop. If an injection current value IBOL in FIG. 12 is 250 mA, for example, the de-tuning width $\lambda$detun is $\lambda$detun=976.8–968.21 nm=8.59 nm as calculated according to $\lambda$(Iop)=976.8 nm and $\lambda$LIMIT=968.21 nm, since Iop is Iop=250 mA.

If the injection current IEOL=300 mA, on the other hand, the de-tuning width $\lambda$detun is $\lambda$detun=978–968.21 nm=9.79 nm as calculated according to λ(Iop)=978 nm, since Iop is Iop=300 mA. In consideration of operating currents within the range from the injection current value IBOL to the injection current value IEOL, therefore, it is evident that the de-tuning width λdetun ranges from 8.59 to 9.79 nm. Based on the difference (=λBG−ΔλBG=978.44 nm) between the reflection center wavelength λBG and the full width at half maximum ΔλBG of the reflection center wavelength λBG, the values of λ(Iop) for the injection current values IBOL and IEOL are on the shorter-wavelength side. It can be seen, therefore, that the present embodiment is based on the setting described in "Disclosure of the invention."

In obtaining the pulling wavelength width λPULL by experiment, the semiconductor laser module having the gain peak wavelength λ(Iop) for the maximum operating current Iop is oscillated with the reflection center wavelength λBG of the Bragg grating, and the temperature is raised from room temperature by means of the Peltier device. Thereupon, the semiconductor laser module changes its oscillation wavelength from the wavelength λBG to the wavelength λFP. Since this wavelength FP is the shorter-wavelength-side limit value λLIMIT of the pulling wavelength width λPULL, the pulling wavelength width λPULL is given by λPULL=λBG−λLIMIT.

In the semiconductor laser module 1 constructed in this manner, the semiconductor laser device 2 and the optical fiber 3 are opposed to each other with the optical coupling means 4 between them in a manner such that the semiconductor laser device 2 and the grating portion 3c are spaced at a distance of about 1 m.

In the semiconductor laser module 1 in this state, the threshold current Ith of the semiconductor laser device 2 was measured and found to be 36.5 mA. FIGS. 9A to 9D individually show spectrum characteristics of the semiconductor laser module 1 obtained by measuring optical outputs (dBm) for the injection current (mA) by means of the spectrum analyzer and an optical output characteristic obtained by measuring an optical output (mW) on the emission side of the optical fiber 3 by means of a power meter.

Figure 9A:
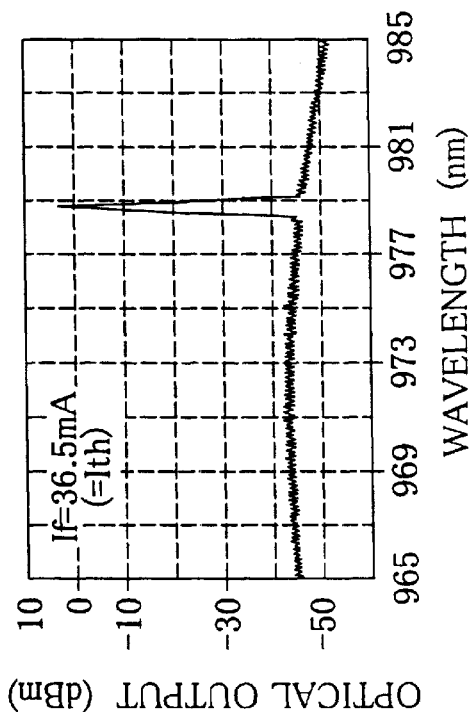
FIGS. 9A to 9C show spectrum characteristic curves illustrating optical outputs (dBm) for the injection current (mA) in the semiconductor laser module of the present invention.
Figure 9B:
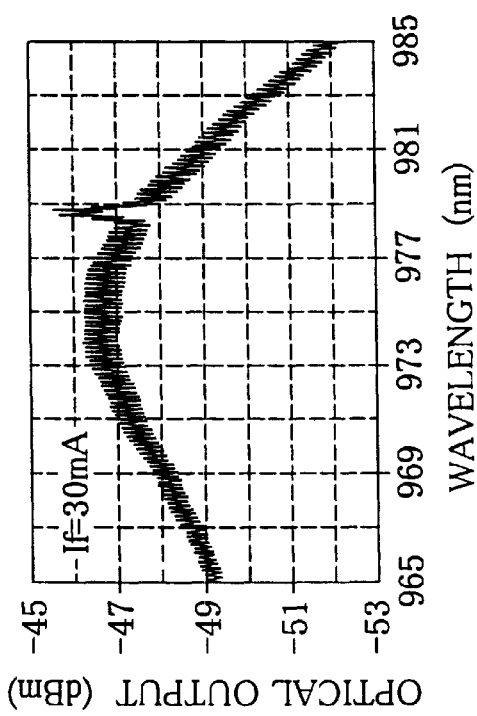
Figure 9C:
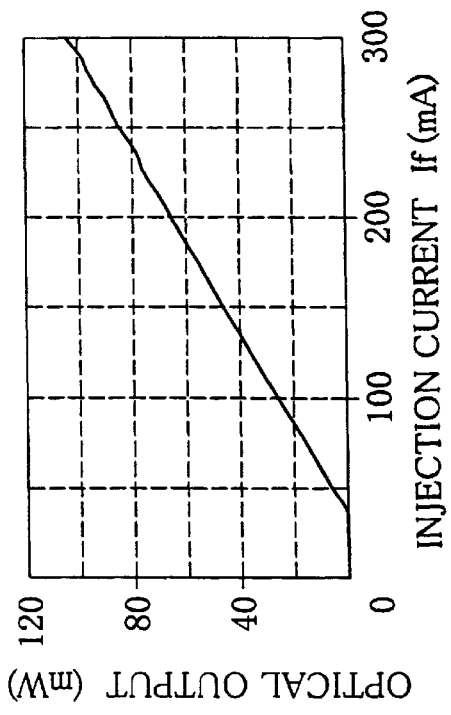

The injection current If in FIG. 9A is at 30 mA (natural emission region not higher than the threshold current Ith of the semiconductor laser device 2), the injection current If in FIG. 9B is at 36.5 mA that is equal to the threshold current Ith, and the injection current If in FIG. 9C is the maximum operating current Iop=300 mA.

As seen from the results shown in FIGS. 9A to 9C, the oscillation wavelengths of the semiconductor laser device 2 for the individual injection currents are located close to the reflection center wavelength λBG (=978.95 nm) of the grating portion 3c. As is evident from FIG. 9B, moreover, the oscillation mode of the semiconductor laser device 2 for the threshold current Ith is a Bragg grating mode and not the Fabry-Perot mode, so that the gain peak wavelength λ(Ith) is greater than the shorter-wavelength-side limit value λLIMIT of the pulling wavelength width λPULL. In the case of FIG. 9C where the injection current If is equal to the maximum operating current Iop=300 mA, moreover, a measured value of the optical output measured with the scanning mode of the spectrum analyzer adjusted to a repeat mode is subject to no change at all. Thus, the optical output was found to be very stable.

Figure 9D:
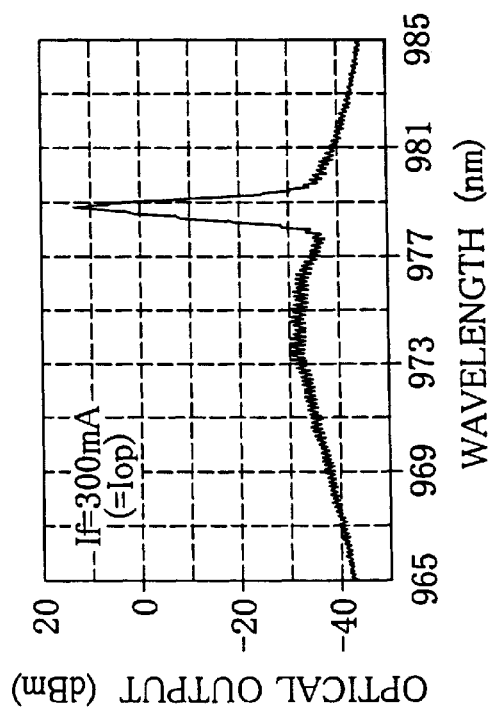
FIG. 9D shows an optical output characteristic curve illustrating an optical output (mW) for the injection current (mA)

As seen from the result shown in FIG. 9D, on the other hand, there is a linear relation between the Injection current (mA) and optical output (mW) of the semiconductor laser device 2 in the semiconductor laser module 1 as long as the injection current is between the threshold current Ith (=36.5 mA) and the maximum operating current Iop (=300 mA).

Figure 8:
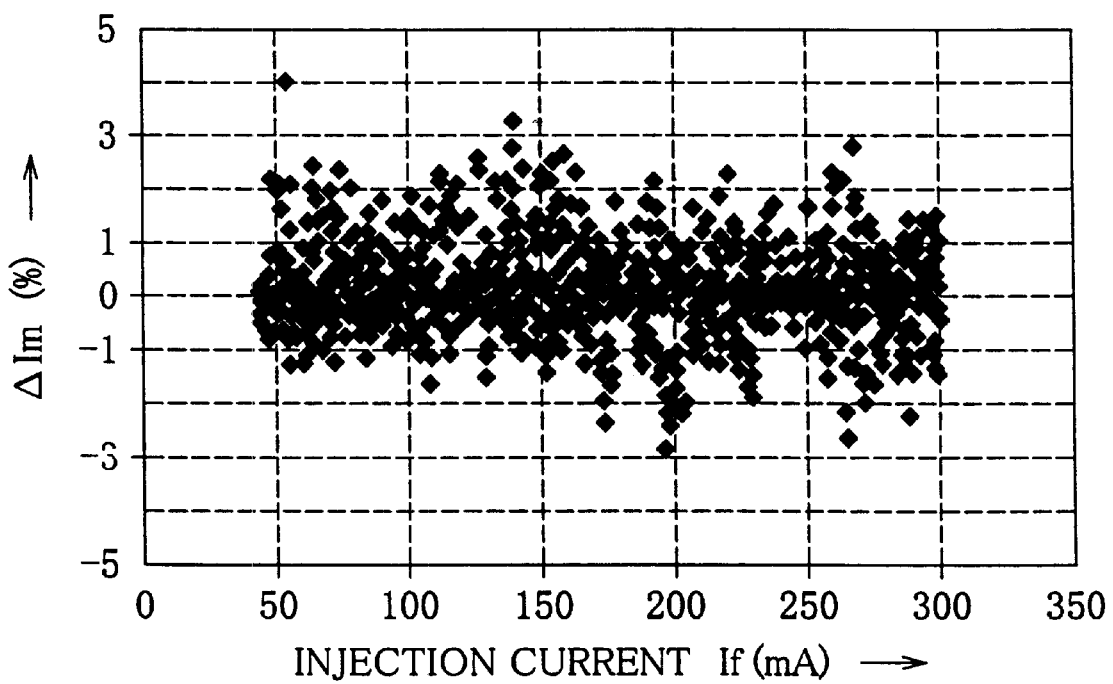
FIG. 8 shows a current dependence characteristic curve illustrating the dependence of a variation ΔIm of the monitor output current Im on the injection current If for the case where the semiconductor laser is used singly in the semiconductor laser module of the present invention.
Figure 10:
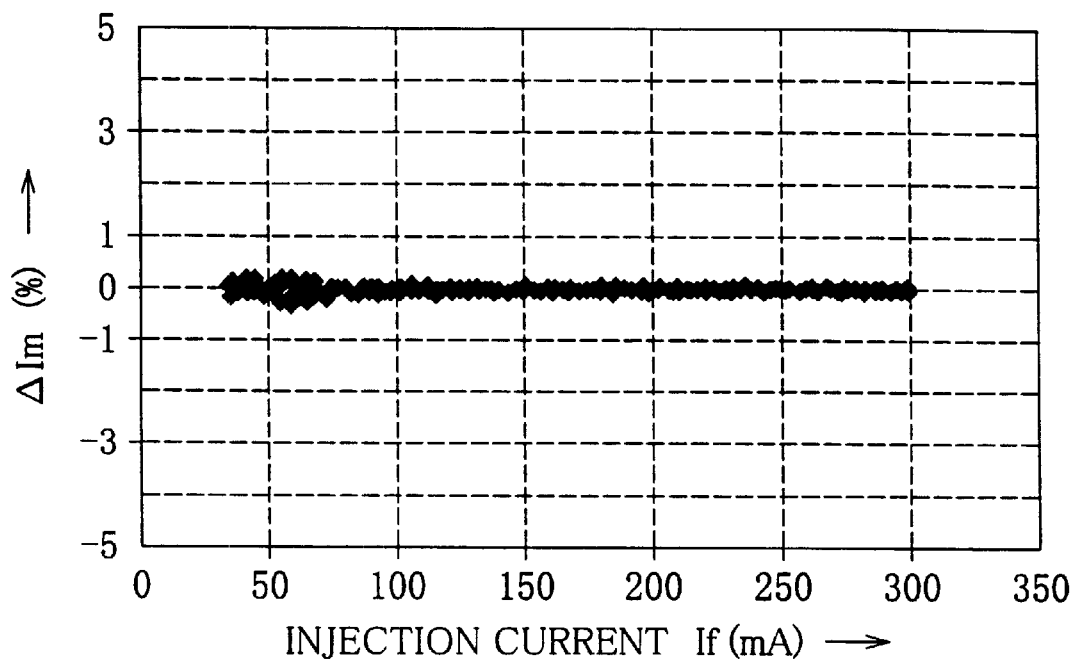
FIG. 10 shows a current dependence characteristic curve illustrating the dependence of the variation ΔIm of the monitor output current Im on the injection current If (mA) of the semiconductor laser in the semiconductor laser module.
Figure 11:
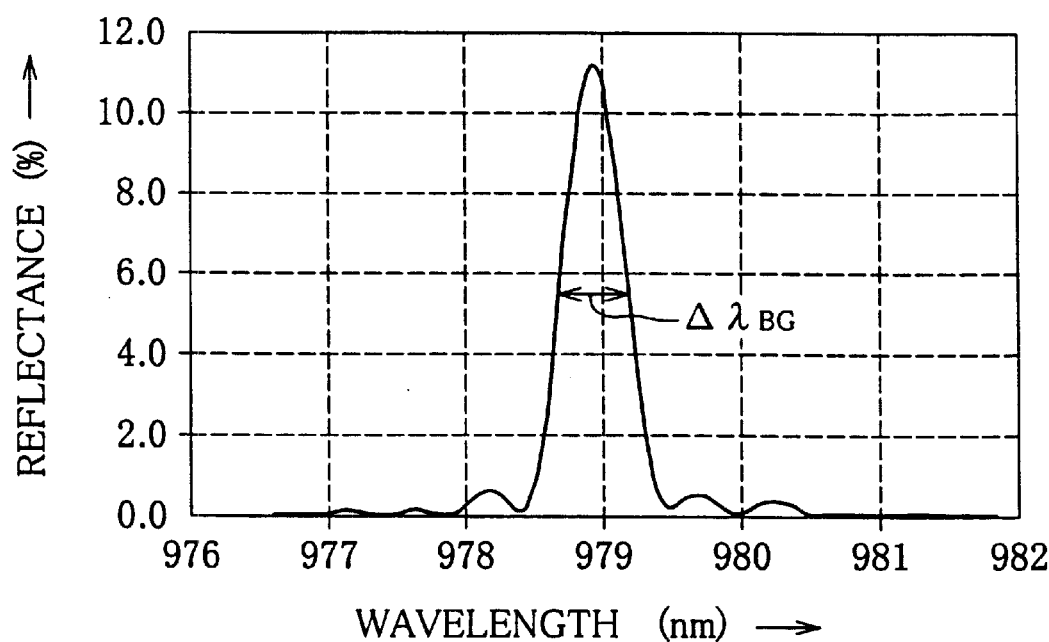
FIG. 11 shows a spectrum characteristic curve for a grating portion formed in an optical fiber used in the semiconductor laser module of FIG. 6.

FIG. 8 shows the result of measurement of the current dependence characteristic of a variation ΔIm (%) of a monitor output current Im on the injection current If (mA) of the semiconductor laser device 2 that is used singly. On the other hand, FIG. 10 shows the result of measurement of the current dependence characteristic of the variation ΔIm (%) of the monitor output current Im on the injection current If (mA) of the semiconductor laser device 2 that is modularized as the semiconductor laser module 1.

Figure 1A:
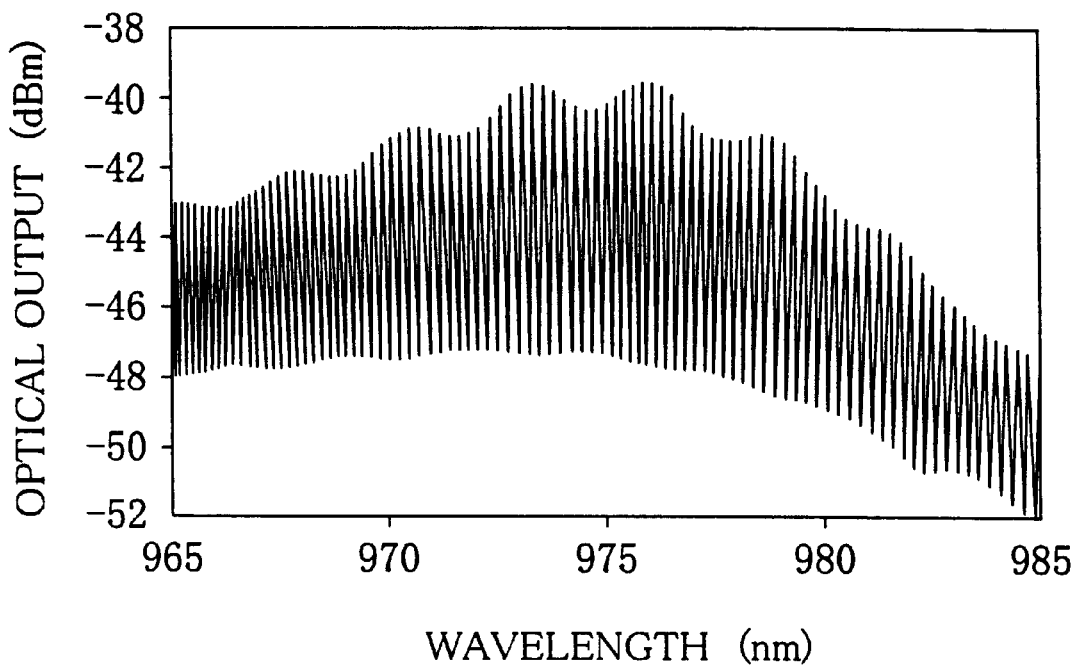
FIG. 1A is a spectrum distribution diagram for a resonance mode form of a gain wavelength characteristic of a GaAs/AlGaAs-based semiconductor laser, a pump laser for optical fiber amplifier, showing an outline of a semiconductor laser module according to the present invention.
Figure 1B:
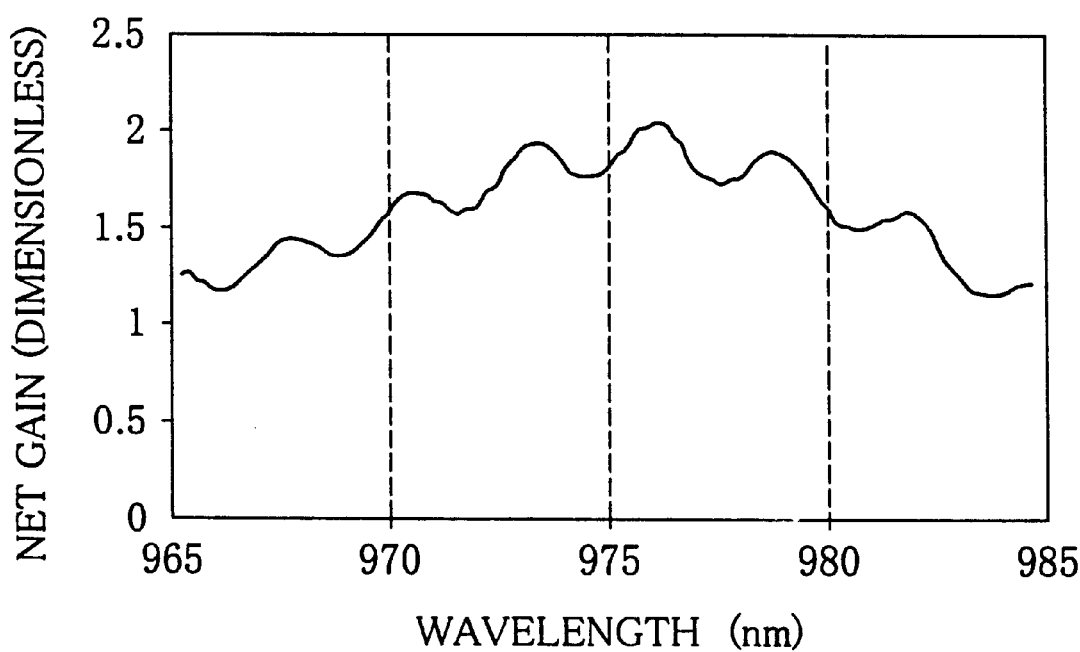
FIG. 1B is a spectrum distribution diagram for a net gain form.
Figure 2A:
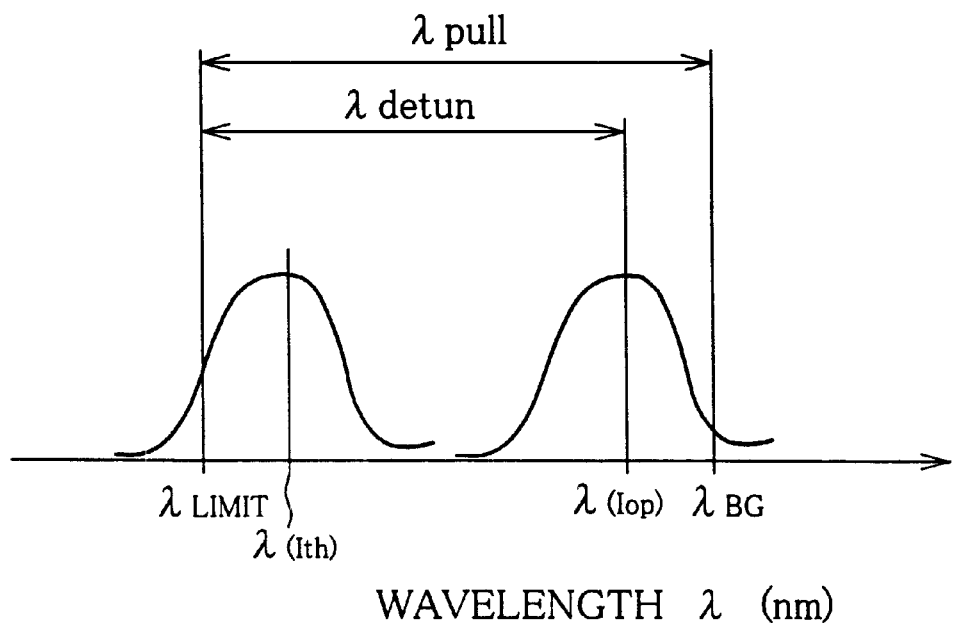
FIG. 2A shows gain-wavelength characteristic curves illustrating optimum relations between a reflection center wavelength λBG of a Bragg grating, pulling wavelength width λPULL, de-tuning width λdetun, shorter-wavelength-side limit value λLIMIT of the pulling wavelength width λPULL, and gain peak wavelengths λ(Iop) and λ(Ith) for the case where an optical output Pf and a monitor output current Im of the semiconductor laser are stable.
Figure 2B:
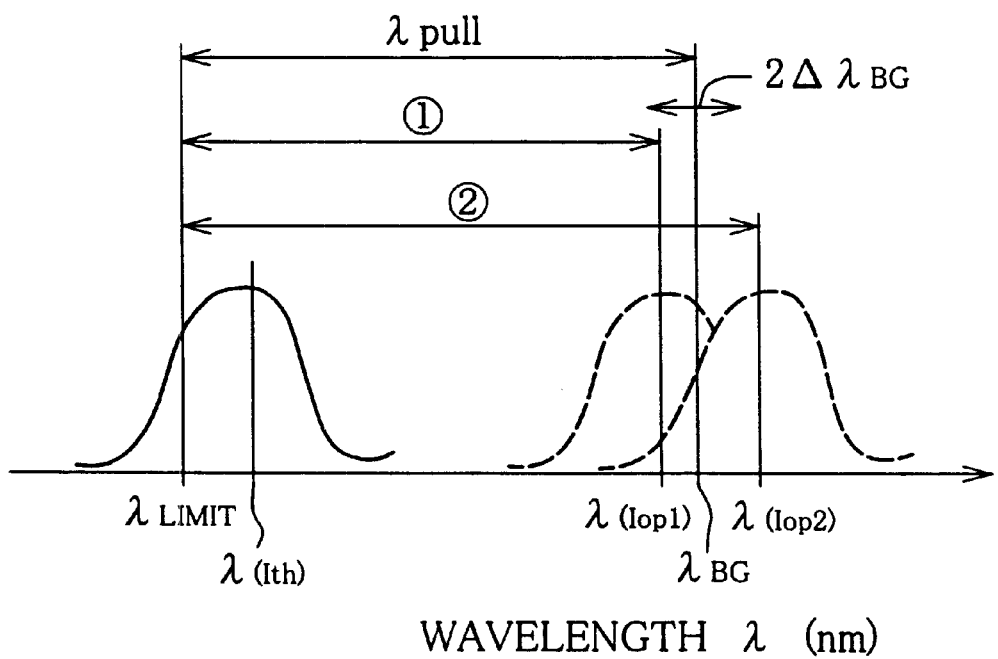
FIG. 2B shows gain-wavelength characteristic curves illustrating relations between the aforesaid elements for the case where the monitor output current Im of the semiconductor laser are considerably unstable.
Figure 3A:
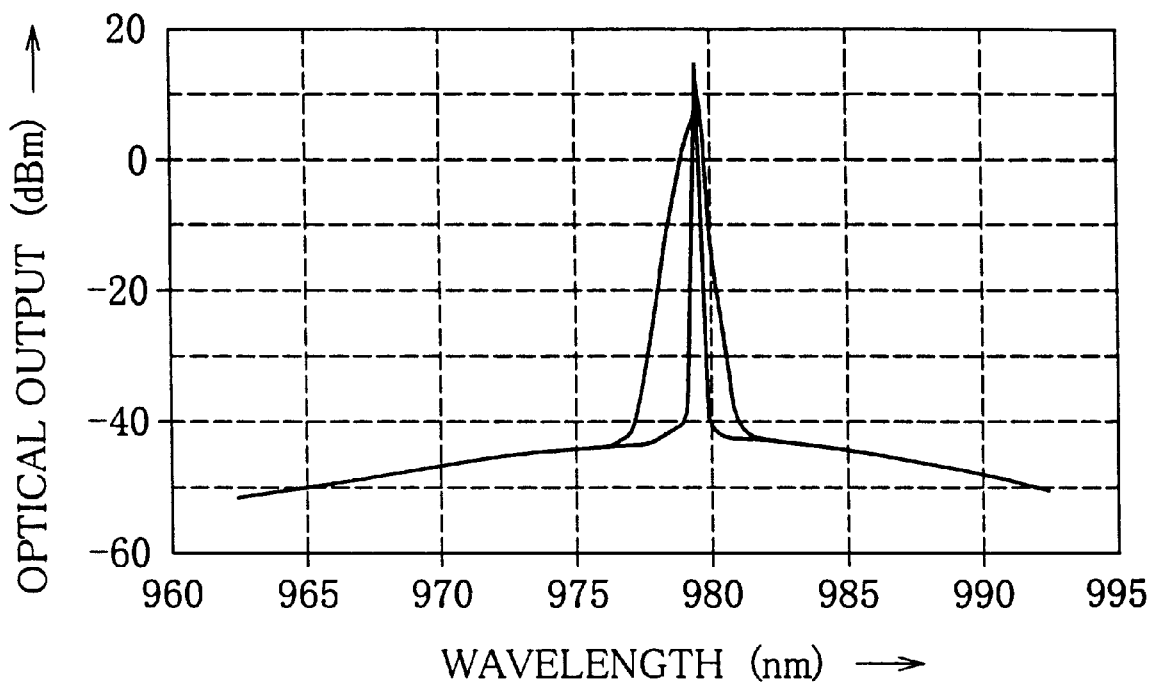
FIG. 3A is a spectrum distribution diagram showing optical outputs in two oscillation states measured in the case where mode competition and temporal mode hopping are caused.
Figure 3B:
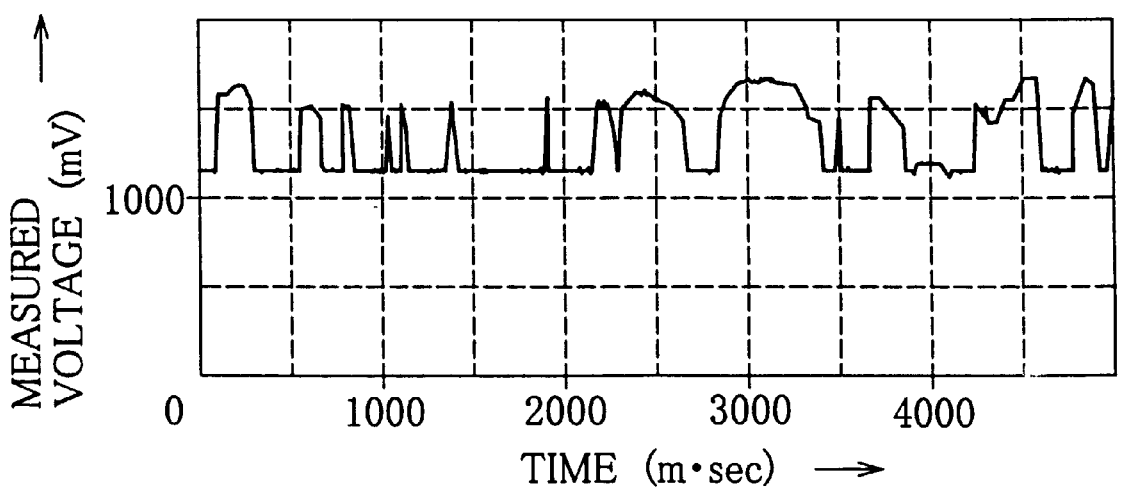
FIG. 3B shows an output characteristic curve illustrating a voltage version of time-based change of the monitor output current Im measured in the case where mode hopping is caused.
Figure 4A:
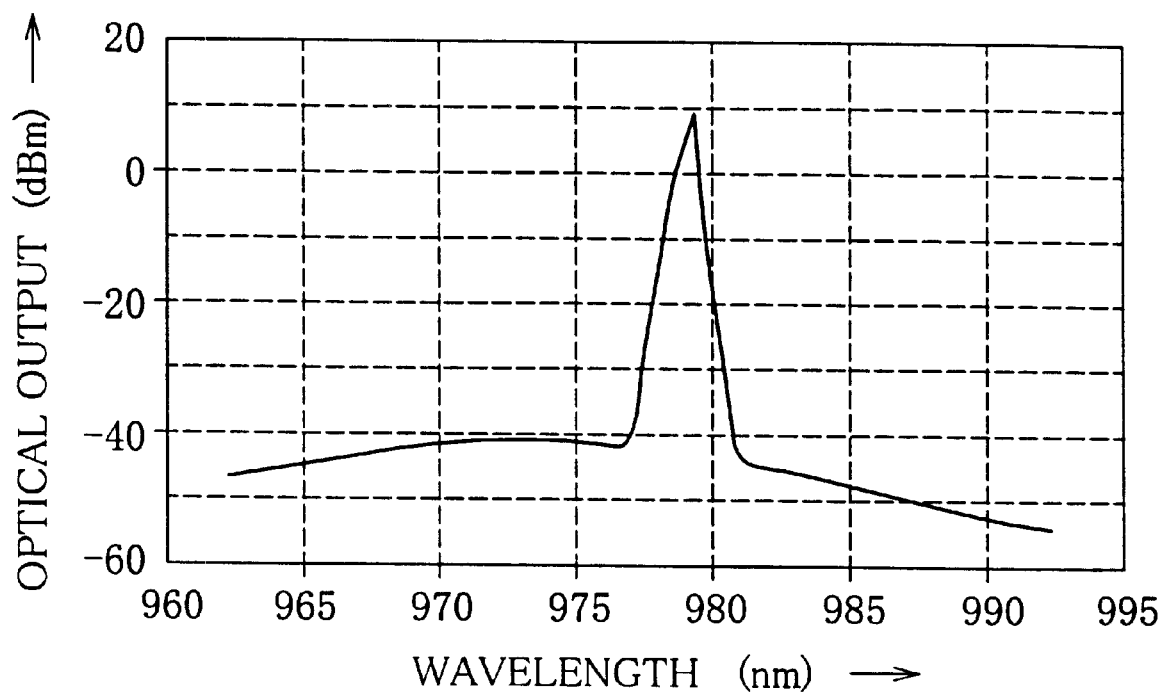
FIG. 4A is a spectrum distribution diagram measured when the optical output Pf and the monitor output current Im of the semiconductor laser are stable.
Figure 4B:
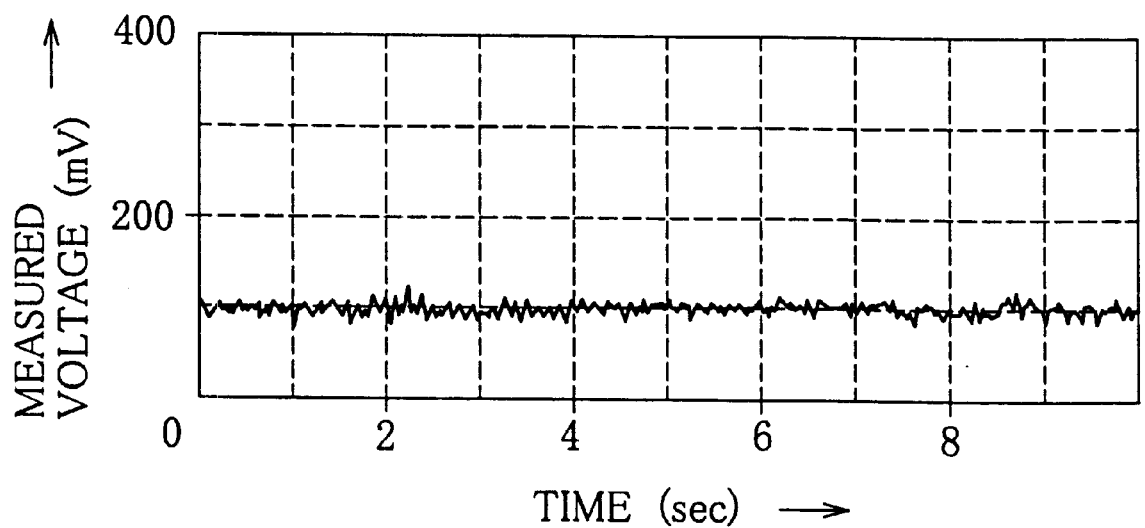
FIG. 4B shows an output characteristic curve illustrating a voltage version of time-based change of the monitor output current Im.

If the pulling wavelength width λPULL and the de-tuning width λdetun are adjusted to the optimum relation of FIG. 2A in which an optical output Pf and the monitor output current Im are stabilized, as seen from the result shown in FIG. 1, the fluctuation of the variation ΔIm (%) of the monitor output current Im in the whole region of the Injection current If can be restricted within ±0.5% with respect to the reflection center wavelength λBG of the grating portion 3c and the gain peak wavelength λ(Ith) of the semiconductor laser device 2.

According to the embodiment described above, the optical fiber 3 having the grating portion 3c formed of a Bragg grating is used as an optical transmission medium that includes the Bragg grating. It is to be understood, however, that a plane optical waveguide may be used instead only If it includes the Bragg grating.

INDUSTRIAL APPLICABILITY

According to a first invention of the present invention, there may be provided a semiconductor laser module that has high oscillation wavelength stability against injection current and temperature change, and is suited for use as a light source for EDFA excitation or a high-output, low-noise light source.

According to a second invention of the present invention, lowering of the optical output that is caused as the semiconductor laser is coupled to the optical transmission medium to be modularized by means of the optical coupling means can be compensated by injecting an operating current equal to the threshold current Ith(LD) for the case where the semiconductor laser is used singly. Thus, lowering of the properties and reliability of the semiconductor laser module, which is attributable to the aforesaid catastrophic optical damage (COD) caused by the increase of the optical power density on the semiconductor laser end face, can be restrained, and the range of the injection currents from the threshold current Ith to the maximum operating current Iop can be widened. According to the second invention, moreover, the oscillation wavelength λLD(Ith) for the threshold current Ith(LD) for the case where the semiconductor laser is used singly is shorter than the oscillation wavelength of the modularized semiconductor laser. Accordingly, the semiconductor laser oscillation state of the semiconductor laser module can be stabilized more easily than in the case where the semiconductor laser is used singly.

According to a third invention of the present invention, the semiconductor laser module is designed so that the optical output Pf and the monitor output current Im of the semiconductor laser can be stabilized more securely.

According to fourth and fifth inventions of the present invention, the semiconductor laser module is designed so that the pulling wavelength width need not be increased unduly and that the pulling wavelength width can be increased by enhancing the efficiency of coupling between the optical transmission medium and the semiconductor laser.

According to a sixth invention of the present invention, the semiconductor laser module is designed so that the characteristics of the semiconductor laser to be used can be easily noticed according to data on the semiconductor laser.

According to a seventh invention of the present invention, the semiconductor laser module can use a conventional GaAs/AlGaAs-based semiconductor laser that has ripples in its gain-wavelength characteristic.

According to an eighth invention of the present invention, the semiconductor laser module is designed so that both the optical output Pf and the monitor output current Im can be stabilized.

According to a ninth invention of the present invention, the semiconductor laser module is designed so that the power ratio can be utilized as a criterion for screening.

According to tenth to twelfth and fifteenth inventions of the present invention, the semiconductor laser module is designed so that lowering of the optical output that is attributable to the connection of the optical transmission medium having the Bragg grating to the semiconductor laser can be restrained, and minimum requirements for the pulling wavelength width can be fulfilled.

According to a thirteenth invention of the present invention, the semiconductor laser module can enjoy stable oscillation characteristics within a narrow wavelength region if the pulling wavelength width λPULL, which is settled depending on parameters such as the reflectance of the anti-reflection film, the gain spectrum full width at half maximum, absorption coefficient, and feedback coupling efficiency, and the reflectance for the reflection center wavelength λBG of the Bragg grating, is 4 nm or more.

According to a fourteenth invention of the present invention, the gain peak wavelength can be controlled properly.

What is claimed is:

1. An external-cavity, semiconductor laser module, comprising:
   a GaAs/AlGaAs-based semiconductor laser configured to produce light at a gain-peak-wavelength $\lambda_{FP}$ when driven to oscillate in a Fabry-Perot oscillation, $\lambda_{LIMIT}$ being a shortest wavelength at which the Fabry-Perot oscillation occurs, and exhibit a gain-wavelength characteristic with ripples therein;
   an optical transmission medium configured to receive the light produced from the semiconductor laser, said optical transmission medium including
      a Bragg grating having a reflection characteristic centered at a reflection center wavelength $\lambda_{BG}$, and a reflection spectrum having a predetermined width at half maximum; and
   an optical coupler configured to couple the light from the semiconductor laser into the optical transmission medium, wherein
   a pulling wavelength range, $\lambda_{PULL}$, being a range of wavelengths between $\lambda_{BG}$ and $\lambda_{LIMIT}$,
   a de-tuning range, $\lambda_{detun}$, being a range of wavelengths between $\lambda_{LIMIT}$ and a gain peak wavelength of the gain-wavelength characteristic of the semiconductor laser at a maximum operating current λ(Iop) of the semiconductor laser,
   $\lambda_{PULL} > \lambda_{detun}$,
   $\lambda_{PULL} - \lambda_{detun} >$ the predetermined width at half maximum of the reflection spectrum, and
   λ(Iop) and $\lambda_{BG}$ being set so that $\lambda_{BG}$ is at least one of
   longer than both λ(Iop) and $\lambda_{FP}$, and
   shorter than both λ(Iop) and $\lambda_{FP}$.

2. A semiconductor laser module according to claim 1, wherein:
   a threshold current (Ith(LD)) of the GaAs/AlGaAs semiconductor laser is higher than a threshold current (Ith) of the external-cavity semiconductor laser module; and
   an oscillation wavelength (λLD(Ith)) for the threshold current (Ith(LD)) is shorter than an oscillation wavelength of the external-cavity semiconductor laser module.

3. A semiconductor laser module according to claim 1, wherein:
   $\lambda_{BG}$ of said Bragg grating is set on a longer-wavelength side of λ(Iop) of said semiconductor laser, which includes at least one gain ripple in the gain-wavelength characteristic of the semiconductor laser.

4. A semiconductor laser module according to claim 3, wherein:
   a gain ripple interval in the gain-wavelength characteristic of said semiconductor laser is not longer than 3.5 nm.

5. A semiconductor laser module according to claim 1, wherein said semiconductor laser undergoes mode hopping, if a gain ripple interval in the gain-wavelength characteristic of the semiconductor laser is 3.5 nm or less.

6. A semiconductor laser module according to claim, 1, wherein:
   a difference between $\lambda_{BG}$ of said Bragg grating and peak wavelength at threshold current λ(Ith) is set at a larger value according to an expression

[λBG−λ(Ith)]>As×(Iop−Ith), where As (nm/mA) is a shift ratio of respective gain peak wavelengths for each injection current in said semiconductor laser, and a threshold current Ith.

7. A semiconductor laser module according to claim 1, wherein:
   a difference between the reflection center wavelength ($\lambda_{BG}$) of said Bragg grating and the gain peak wavelength at threshold current λ(Ith) is set at 7 nm or more.

8. A semiconductor laser module according to claim 1, wherein:
   60% or more of a spectral component of an optical output power of said semiconductor laser module is concentrated within ±1 a full width at half maximum of the reflection center wavelength $\lambda_{BG}$ of said Bragg grating, and less than 40% of the spectral component is within ±1 gain ripple interval of a gain peak wavelength λLD(I) for an injection current (I) when said semiconductor laser is used by itself.

9. A semiconductor laser module according to claim 8, wherein:
   a power ratio between optical output power for said reflection center wavelength $\lambda_{BG}$ and optical output power for said gain peak wavelength λLD(I) is 10 dB or more.

10. A semiconductor laser module according to claim 1, wherein:
    a full width at half maximum of a gain spectrum of said semiconductor laser is 15 nm or more.

11. A semiconductor laser module according to claim 1, wherein:
    an absorption coefficient of said semiconductor laser is 15 cm$^{-1}$ or less.

12. A semiconductor laser module according to claim 1, wherein:

an efficiency of coupling by said optical coupler between said semiconductor laser and said optical transmission medium is 60% or more.

13. A semiconductor laser module according to claim 1, wherein:

a front end face of said semiconductor laser is coated with an anti-reflection film having a reflectance of 6% or less.

14. A semiconductor laser module according to claim 1, wherein:

said semiconductor laser includes a temperature control mechanism configured to control an operating temperature of said semiconducting laser to enable a desired gain peak wavelength $\lambda LD(I)$ to be outputted for a given injection current (I).

15. A semiconductor laser module according to claim 1, wherein:

a reflectance of said optical transmission medium for the reflection center wavelength $\lambda_{BG}$ of the Bragg grating is 3% or more.

* * * * *

UNITED STATES PATENT AND TRADEMARK OFFICE
CERTIFICATE OF CORRECTION

PATENT NO. : 6,335,944 B1
DATED : January 1, 2002
INVENTOR(S) : Mugino et al.

Page 1 of 1

It is certified that error appears in the above-identified patent and that said Letters Patent is hereby corrected as shown below:

<u>Title page,</u>
Item [73], the Assignee's information should read:

(73)   Assignee:   The Furukawa Electric Co., Ltd, Tokyo, (JP)

Signed and Sealed this

Fourteenth Day of May, 2002

Attest:

JAMES E. ROGAN
*Attesting Officer*      *Director of the United States Patent and Trademark Office*